US006984892B2

(12) United States Patent
Gotkis et al.

(10) Patent No.: US 6,984,892 B2
(45) Date of Patent: Jan. 10, 2006

(54) SEMICONDUCTOR STRUCTURE IMPLEMENTING LOW-K DIELECTRIC MATERIALS AND SUPPORTING STUBS

(75) Inventors: Yehiel Gotkis, Fremont, CA (US); David Wei, Fremont, CA (US); Rodney Kistler, Los Gatos, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 09/821,415

(22) Filed: Mar. 28, 2001

(65) Prior Publication Data

US 2005/0194688 A1  Sep. 8, 2005

(51) Int. Cl.
 *H01L 23/48* (2006.01)
 *H01L 29/00* (2006.01)
(52) U.S. Cl. .................. 257/758; 257/522; 257/773
(58) Field of Classification Search .............. 257/522, 257/642, 643, 758, 759, 762, 773, 774; 438/214, 438/280, 319, 411, 461, 611, 619
See application file for complete search history.

(56) References Cited

U.S. PATENT DOCUMENTS

| 5,034,799 A | | 7/1991 | Tomita et al. ............... 357/71 |
| 5,798,559 A | * | 8/1998 | Bothra et al. ............... 257/522 |
| 5,828,121 A | | 10/1998 | Lur et al. ................... 257/522 |
| 6,057,224 A | | 5/2000 | Bothra et al. ............... 438/619 |
| 6,078,088 A | * | 6/2000 | Buynoski ................... 257/410 |
| 6,190,957 B1 | * | 2/2001 | Mochizuki et al. ......... 438/240 |
| 6,277,728 B1 | * | 8/2001 | Ahn et al. .................. 438/619 |
| 6,333,255 B1 | * | 12/2001 | Sekiguchi .................. 438/622 |
| 6,573,170 B2 | * | 6/2003 | Aoyagi et al. .............. 438/612 |
| 6,717,267 B1 | * | 4/2004 | Kunikiyo .................... 257/758 |

FOREIGN PATENT DOCUMENTS

| EP | 0872887 A2 | 10/1998 |
| JP | 63-313896 | 12/1988 |

OTHER PUBLICATIONS

Zielinski et al., "Damascene Integration of Copper and Ultra-Low-k Xerogel for High Performance Interconnects", p. 31.7.1 to 31.7.3, IEDM 1997, Texas Instruments, Dallas, TX.

* cited by examiner

*Primary Examiner*—Hung Vu
(74) *Attorney, Agent, or Firm*—Martine Penilla & Gencarella, LLP

(57) ABSTRACT

A semiconductor device is provided. The semiconductor device includes a substrate having transistor devices and a plurality of copper interconnect metallization lines and conductive vias. The plurality of copper interconnect metallization lines and conductive vias are defined in each of a plurality of interconnect levels of the semiconductor device such that the plurality of copper interconnect metallization lines and conductive vias are isolated from each other by an air dielectric. The semiconductor device further includes a plurality of supporting stubs each of which is configured to form a supporting column that extends through the plurality of interconnect levels of the semiconductor device.

8 Claims, 9 Drawing Sheets

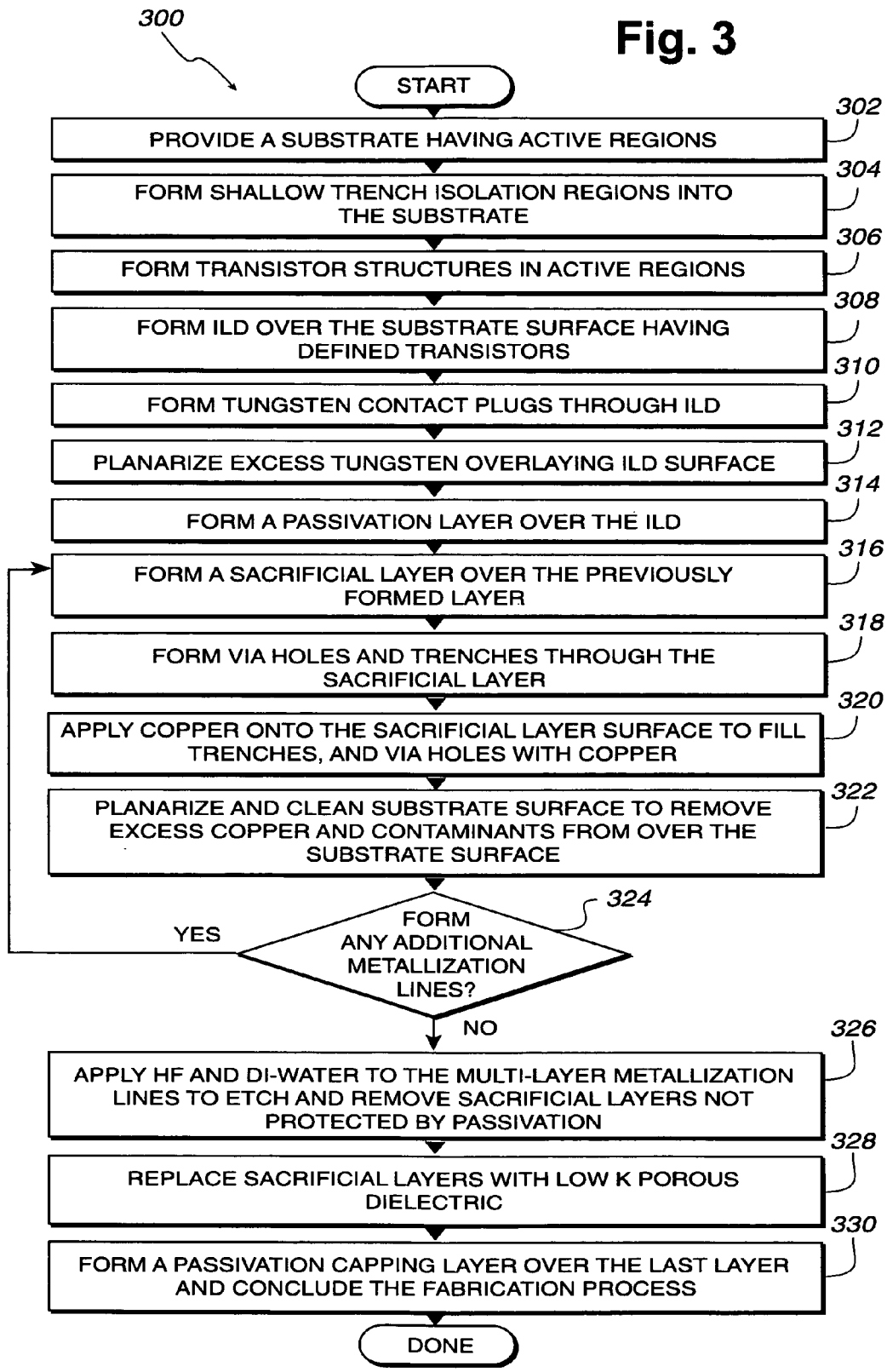

SEMICONDUCTOR STRUCTURE IMPLEMENTING LOW-K DIELECTRIC MATERIALS AND SUPPORTING STUBS

BACKGROUND OF THE INVENTION

1. Field of the Invention

The present invention relates generally to semiconductor device fabrication technology and techniques for improving the performance of semiconductor devices. Specifically, the present invention relates to implementing sacrificial materials to enhance the performance of semiconductor devices.

2. Description of the Related Art

As is well known, the semiconductor industry is moving toward implementing larger substrates having higher density with devices having smaller features. To achieve this task, millions of transistors are connected through multiple layers of interconnect metallization lines, insulating dielectric layers, and conductive via structures and are fabricated on a wafer substrate. Originally, metallization lines and vias were predominantly formed from aluminum, as it is relatively inexpensive, easy to etch, and has relatively low resistivity, while insulators were made predominantly from silicon dioxide. However, due to the decrease in the size of the device features, vias and contact holes as well as the distance between the metallization lines in conjunction with system-on-chip evolution, there is an increased demand to improve semiconductor device performance through changing the materials implemented in semiconductor fabrication. So far, this has been a two-fold task.

First, rather than aluminum, copper interconnect lines, vias, and contact holes are being implemented. Replacing of aluminum with copper has been favorable, as the latter has lower resistivity and better conductivity and electromigration properties than the former. However, replacing aluminum with copper has been problematic, as it mandates a fundamental change in the metal interconnect formation. Specifically, while aluminum interconnects are formed by etching out unprotected portions of the thin aluminum film overlaid on the surface of the substrate, copper interconnects are formed through depositing copper into via holes and trenches that are etched into dielectric layers. As a result, in a semiconductor device having copper interconnects, a planarization operation must be performed on the substrate surface so as to remove overburden copper from non-trench, via or contact plug areas of the dielectric.

Second, instead of silicon dioxide, dielectric materials with low dielectric permittivity, or so-called low-K dielectric materials, are being used as insulators. Low-K dielectric materials are preferred because first, they reduce interconnect-to-interconnect capacitance, as the coupling capacitance between two metallization lines placed in close proximity of each other is directly proportional to the dielectric constant of the insulating dielectric material used. Second, low-K dielectric materials reduce cross-talk noise, since the lower is the dielectric constant of a dielectric, the lower is the possibility of cross-metallization line signal interference. By way of example, while the predominantly used dielectric, silicon dioxide, has a dielectric constant of about 4.0, air has the lowest dielectric constant of 1.0, and other low-K dielectric materials ranging from about 1.5 and about 3.5. As air has been recognized to have the lowest dielectric constant, there has been a trend in the semiconductor fabrication technology to manufacture dielectric materials with dielectric constants close to that of air.

So far, such attempts have resulted in producing highly porous dielectric materials. However, the poor mechanical strength of such porous dielectric materials as well as the current state of the semiconductor fabrication technology hinder their implementation in the semiconductor fabrication process. Particularly, the poor mechanical strength of low-K dielectric materials is problematic during the chemical mechanical planarization (CMP) operation performed on copper metallization lines. As is well known, in a CMP operation, the substrate surface is applied onto a moving polishing pad with force, thus removing the overburden metal from over the substrate surface. However, performing a CMP operation on a semiconductor device having porous low-K dielectric material is complicated as the application of the substrate surface onto the polishing pad may cause regions of the semiconductor structure to collapse or crack, thus hindering performance or requiring that the fabricated semiconductor wafer be discarded. As can be appreciated, when these problems are introduced during semiconductor fabrication processes, the yield of good chips can dramatically decrease, in addition to reducing wafer throughput.

In view of the foregoing, a need exists for semiconductor structures that can be fabricated using conventional techniques that provide good structural support during CMP operations, while still producing devices having low capacitive delays such as those implementing low-K dielectric materials.

SUMMARY OF THE INVENTION

Broadly speaking, the present invention fills these needs by enabling the fabrication of semiconductor structures using standard dielectric materials that can withstand mechanical stresses and pressures common in chemical mechanical planarization. In one preferred embodiment, a sacrificial material is used to fabricate each layer of copper interconnects of a semiconductor structure which is subsequently etched away and replaced with an insulator having a low dielectric permittivity (low-K). In another implementation, a plurality of supporting stubs are formed within each sacrificial layer, thus defining continuous supporting columns for when the sacrificial material is etched away. It should be appreciated that the present invention can be implemented in numerous ways, including as a process, an apparatus, a system, a device, or a method. Several inventive embodiments of the present invention are described below.

In one embodiment, a semiconductor device is disclosed. The semiconductor device includes a substrate having transistor devices and a plurality of copper interconnect metallization lines and conductive vias. The plurality of copper interconnect metallization lines and conductive vias are defined in each of a plurality of interconnect levels of the semiconductor device such that the plurality of copper interconnect metallization lines and conductive vias are isolated from each other by an air dielectric. The semiconductor device further includes a plurality of supporting stubs each of which is configured to form a supporting column that extends through the plurality of interconnect levels of the semiconductor device.

In another embodiment, a semiconductor device is disclosed. The semiconductor device includes a substrate having transistor devices and a plurality of copper interconnect metallization lines and conductive vias. The plurality of copper interconnect metallization lines and conductive vias are defined in each of a plurality of interconnect levels of the semiconductor device such that the plurality of copper interconnect metallization lines and conductive vias are isolated from each other by a porous dielectric material. The semiconductor device further includes a plurality of supporting stubs each of which is configured to form a supporting column that extends through the plurality of interconnect levels of the semiconductor device.

In still a further embodiment, a method for making a semiconductor device is disclosed. The method starts by forming transistor structures on a substrate. Thereafter, interconnect metallization structures are formed in a plurality of levels through depositing a sacrificial layer, performing a dual damascene process to etch trenches and vias, and filling and planarizing the trenches and vias. Thereafter, the sacrificial layer is etched throughout the plurality of levels of the interconnect metallization structures, thus leaving a voided interconnect metallization structure. The voided interconnect metallization structure is then filled with low K dielectric material, thus defining a low K dielectric interconnect metallization structure.

In yet another embodiment, a method for making a semiconductor device is disclosed. The method starts with forming transistor structures on a substrate, which is followed by forming interconnect metallization structures in a plurality of levels. The interconnect metallization structures are formed through depositing a sacrificial layer, performing a dual damascene process to etch trenches, vias, and stubs, and filling and planarizing the trenches, vias, and stubs. Subsequently, the sacrificial layer is etched away throughout the plurality of levels of the interconnect metallization structure leaving a voided interconnect metallization structure and supporting stubs.

The advantages of the present invention are numerous. Most notably, even though the semiconductor structure of the present invention ultimately implements air or low-K dielectric materials as a dielectric, the semiconductor structure of the present invention withstands the structural stresses and pressures that occur during CMP and other operations. In this manner, while inter-metal dielectric capacitance is minimized and faster integrated circuit devices are produced, the shortcomings associated with implementing air or low-K dielectric materials in semiconductor fabrication processes are substantially eliminated.

Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

FIGS. 1F-2 a simplified, partial, exploded, cross-sectional view of the post-etched low-K dielectric filled semiconductor structure of FIG. 1F being covered with a passivation-capping layer, in accordance with yet another embodiment of the present invention.

FIG. 1F-3 is a simplified, partial, exploded, cross-sectional view of the post-etched multi-layer semiconductor structure of FIG. 1D having a low-K dielectric layers, as covered with a passivation-capping layer, in accordance with still another embodiment of the present invention.

FIG. 2 is a flow chart diagram of the process operations performed to fabricate an air dielectric semiconductor structure having a plurality of copper metallization lines and supporting stubs, in accordance with another aspect of the present invention.

FIG. 3 is a generic flow chart method operations process to fabricate a porous low-K dielectric semiconductor structure having a plurality of copper metallization lines, in accordance with yet another embodiment of the present invention.

DETAILED DESCRIPTION OF EXEMPLARY EMBODIMENTS

Embodiments for making semiconductor structures that optimize semiconductor performance by minimizing inter-metal dielectric capacitance are described. In one preferred embodiment, a sacrificial material is used during the fabrication of each layer of copper interconnects and then is etched out and replaced with an insulator having a low dielectric constant. In another embodiment, a plurality of stubs are formed in the sacrificial layer, thus creating nearly continuous supporting columns for when the sacrificial layer is etched away. In preferred implementations, the substantially continuous supporting columns of stubs are configured to extend from the passivation layer to a passivation-capping layer, thus forming a semiconductor structure having high structural integrity with reduced capacitance related delay. In a preferred embodiment, the plurality of stubs are constructed from copper. In another embodiment, the sacrificial layer is a dielectric and the low-K dielectric material is a porous dielectric material.

In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

Figure 1A:
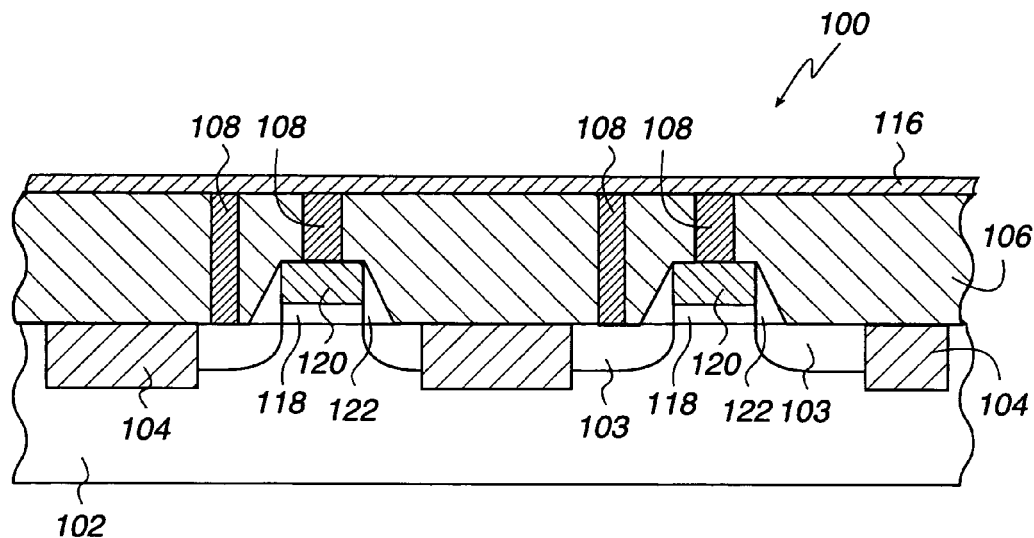
FIG. 1A is a simplified, partial, exploded, cross-sectional view of a semiconductor structure having an interlevel dielectric (ILD) formed over a substrate that has a plurality of active devices, in accordance with one embodiment of the present invention.

FIG. 1A is a cross-sectional view of a semiconductor structure 100 having an inter-level dielectric (ILD) formed over a substrate 102 that has a plurality of transistors, in accordance with one embodiment of the present invention. As shown, each of the fabricated transistors includes a plurality of source/drain diffusion regions 103 formed within the substrate 102. Each of the transistors further includes a conductor polysilicon gate 120, each of which is separated from the substrate 102 by a dielectric gate oxide 118. In one embodiment, source/drain regions 103, which are also known as P-type or N-type regions, may be formed through a doping process that implements impurities such as boron or phosphorous. As shown, the source/drain regions 103 are separated by a plurality of shallow trench isolation regions 104 also formed within the substrate 102. As designed, the shallow trench isolation regions 104 are made out of a non-conducting material (e.g., silicon dioxide, silicon nitride, etc.). Formed along each of the sidewalls of each of the gate oxides 118 and polysilicon gates 120 are a plurality of dielectric spacers 122.

Further shown is the interlevel dielectric (ILD) 106 as it is formed over the substrate 102. In preferred examples, the ILD 106 is constructed from silicon oxide. However, it must be understood by one of ordinary skill in the art that the ILD 106 may be constructed from any other suitable dielectric material so long as the material is substantially robust and provides ample insulation. The Inter-Level Dielectric layers normally are abbreviated as ILD 1, ILD 2 etc. Inter-Metal Dielectric (IMD) or Pre-Metal Dielectric (PMD) for the first post-device dielectric layer, are also frequently used to describe the integrated circuit architecture.

Defined within the ILD 106 are a plurality of contact holes 108 configured to be filled with a conductive material (i.e., forming a plug), thus allowing substantially direct electrical access between the metallization lines and the transistors (i.e., active components). In one implementation, the contact plugs are formed by depositing a layer of tungsten and then planarizing away the overburden tungsten from over the top surface of the ILD 106.

Although in this embodiment the contact holes 108 are filled with tungsten, one of ordinary skill in the art should appreciate that the contact holes 108 may be filled with any conductive material so long as their function of providing direct layer to layer electrical access between the metal interconnects and the active components can be achieved. Additionally, although in this example a CMP operation is used to remove the overburden materials, one of ordinary skill in the art must appreciate that any other planarization or material removal operation may be implemented.

Following the planarization operation, a passivation layer 116 is formed over the ILD 106 so as to protect active components from corrosion and chemical reactions during the subsequent fabrication operations. In one example, the passivation layer 116 is made out of silicon nitride (SiN).

Figure 1B:
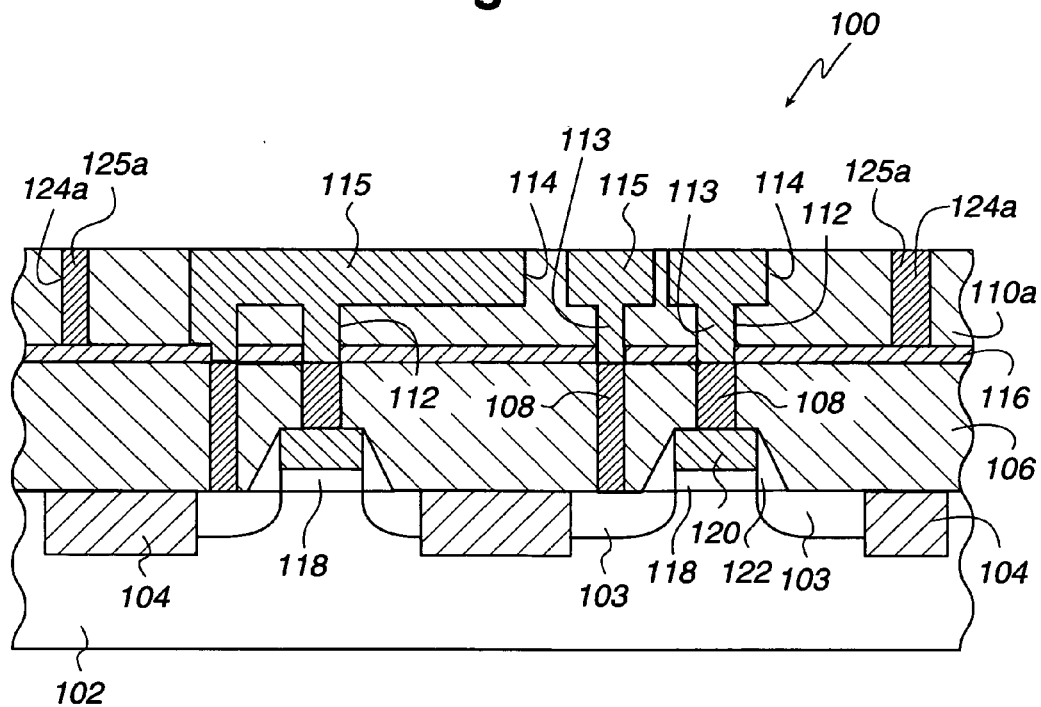
FIG. 1B is a simplified, partial, exploded, cross-sectional view of the semiconductor structure of FIG. 1A further including a first sacrificial layer having a plurality of fabricated metallization lines, vias, and stubs, in accordance with another embodiment of the present invention.

FIG. 1B depicts the semiconductor structure 100 of FIG. 1A further including a first sacrificial layer 110a having a plurality of fabricated metallization lines 115, via holes 112, and stub holes 124a, in accordance with one embodiment of the present invention. As shown, overlaying the passivation layer 116 is the first sacrificial layer 110a, which in one embodiment, may be formed through a Chemical Vapor Deposition (CVD) method. The first sacrificial layer 110a is preferably a silicon dioxide (SiO$_2$) deposited using any proper deposition process. In one embodiment, silicon dioxide may be deposited by decomposing a tetraethylorthosilicate "TEOS" Si(OC$_2$H$_5$)$_4$ reactant using any suitable deposition method. Suitable deposition methods may include a chemical vapor deposition (CVD), a low pressure chemical vapor deposition (LPCVD), an atmospheric pressure chemical vapor deposition (APCVD), sub atmospheric chemical vapor deposition (SACVD), a plasma enhanced chemical vapor deposition (PECVD), etc. Although in this embodiment the sacrificial layer is made out of silicon dioxide, in a different example, the sacrificial layer 110a may be made out of any inert to copper material that is mechanically firm to be implemented during the fabrication process.

Following the formation of the first sacrificial layer 110a, a copper dual damascene process is performed to form interlayer metallization lines and conductive vias within the first sacrificial layer 110a. In one implementation, first, the plurality of via holes 112 are formed. This task may be achieved by overlaying the first sacrificial layer 110a with a photoresist mask and subsequently etching and removing the unprotected portions of the first sacrificial layer 110a down to the surface of the passivation layer 116 and to the contact holes 108.

In preferred embodiments, in addition to the via holes 112, a plurality of stub holes 124a are formed within the first sacrificial layer 110a implementing almost the same processes as the via holes 112. That is, a plurality of stub-shaped patterns are masked over the surface of the first sacrificial layer 110a, which are subsequently etched and removed down to the surface of the passivation layer 116. Next, implementing the same techniques, a plurality of trenches 114 are formed within the first sacrificial layer 110a such that each of the plurality of trenches 114 substantially aligns with a masked via hole 112.

At this point, a layer of metal is deposited onto the surface of the first sacrificial layer 110a and into the trenches 114, via holes 112, and stub holes 124a. In one embodiment, the trenches 114 are filled with copper through sputtering and electroplating processes, thus defining a plurality of metallization lines 115 and conductive vias. In one implementation, prior to metal deposition, a barrier layer (not shown in this Figure) may be deposited over the surface of the first sacrificial layer 110a and into the plurality of via holes 112 and trenches 114. Exemplary metals that may be used to form a barrier layer typically include a tantalum material or a tantalum nitride material, or a combination of both. Thereafter, a copper seed layer (also not shown in this drawing) maybe deposited on the barrier layer in order to line the inner walls and surfaces within the plurality of via holes 112 and trenches 114. The seed layer is configured to establish a good electrical contact for subsequent copper electrodeposition process.

As fabricated, the function of each of the plurality of stubs 125a is to support the multi-layer structure of the semiconductor structure 100. Thus, as opposed to the plurality of conductive vias 113 which are configured to provide electrical connection between different interconnect layers, the function of the stubs 125a is to provide a semiconductor structure having high structural integrity. Accordingly, it should be understood that a semiconductor device may have any number of stubs 125 distributed so as to achieve the best structural support arrangement. Furthermore, although in this embodiment the stub holes 124a are filled with copper, in a different example, the stub holes 124a may be filled with any non-sacrificial material or metal so long as the material used is sufficiently robust to support a subsequently formed passivation-capping layer 118.

Following the formation of the metallization lines 115, conductive vias 113, and stubs 125a a CMP operation is performed on the copper layer that overlies the surface of the first sacrificial layer 110a so as to remove overburden copper from the surface of the sacrificial layer 110a.

Figure 1C:
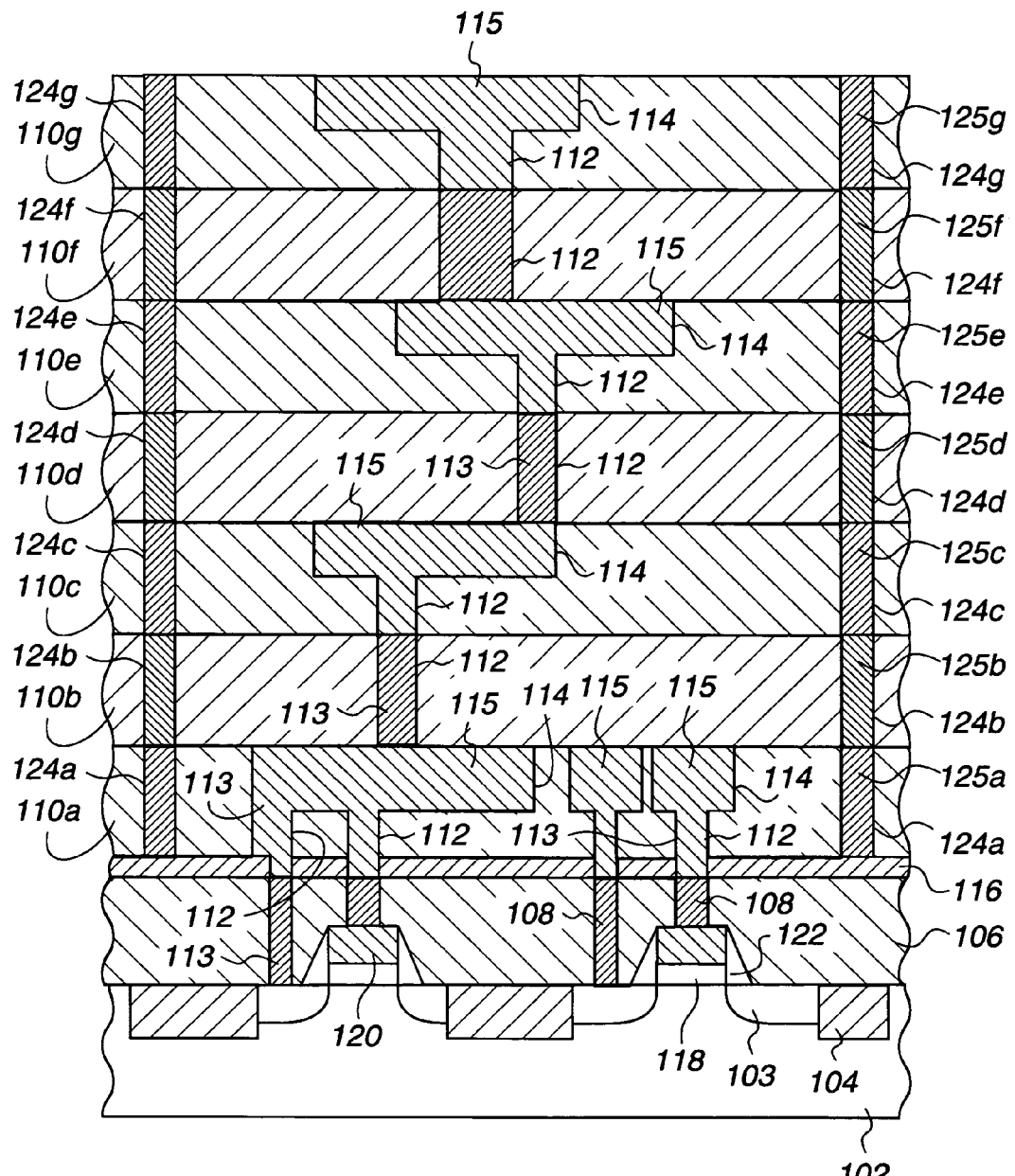
FIG. 1C is a simplified, partial, exploded, cross-sectional view of the semiconductor structure of FIG. 1B having a plurality of fabricated sacrificial layers, each including a plurality of stubs, in accordance with yet another embodiment of the present invention.

Reference is now made to FIG. 1C, which depicts the semiconductor structure 100 of FIG. 1B having a plurality of fabricated sacrificial layers 110b–110g, each including a plurality of stubs 125b–125g, in accordance with one embodiment of the present invention. In one exemplary embodiment, the second, third, fourth, fifth, sixth, and seventh sacrificial layers 110b–110g and each of their respective trenches 114, metallization lines 115, via holes 112, conductive vias 113, stub holes 124b–124g, and stubs 125b–125g are formed in the same manner and from the same materials as the first sacrificial layer 110a and its respective trenches 114, metallization lines 115, via holes 112, conductive vias 113, stub holes 124a, and stubs 125a.

As illustrated, the plurality of stubs 125b–125g are formed within the first through seventh sacrificial layers 110b–110g, respectively, such that each of the plurality of stubs 125b–125g is aligned with one of the plurality of stubs 125a. That is, each of the plurality of stubs 125g, together with its respective group of aligned stubs formed within each of the sacrificial layers 110a–110f, defines a substantially contiguous supporting column, as each extends from the surface of the passivation layer 116 to the surface of the seventh sacrificial layer 110g. In this manner, the stubs 125a–125g provide adequate support for a subsequently formed passivation-capping layer 118.

Figure 1D:
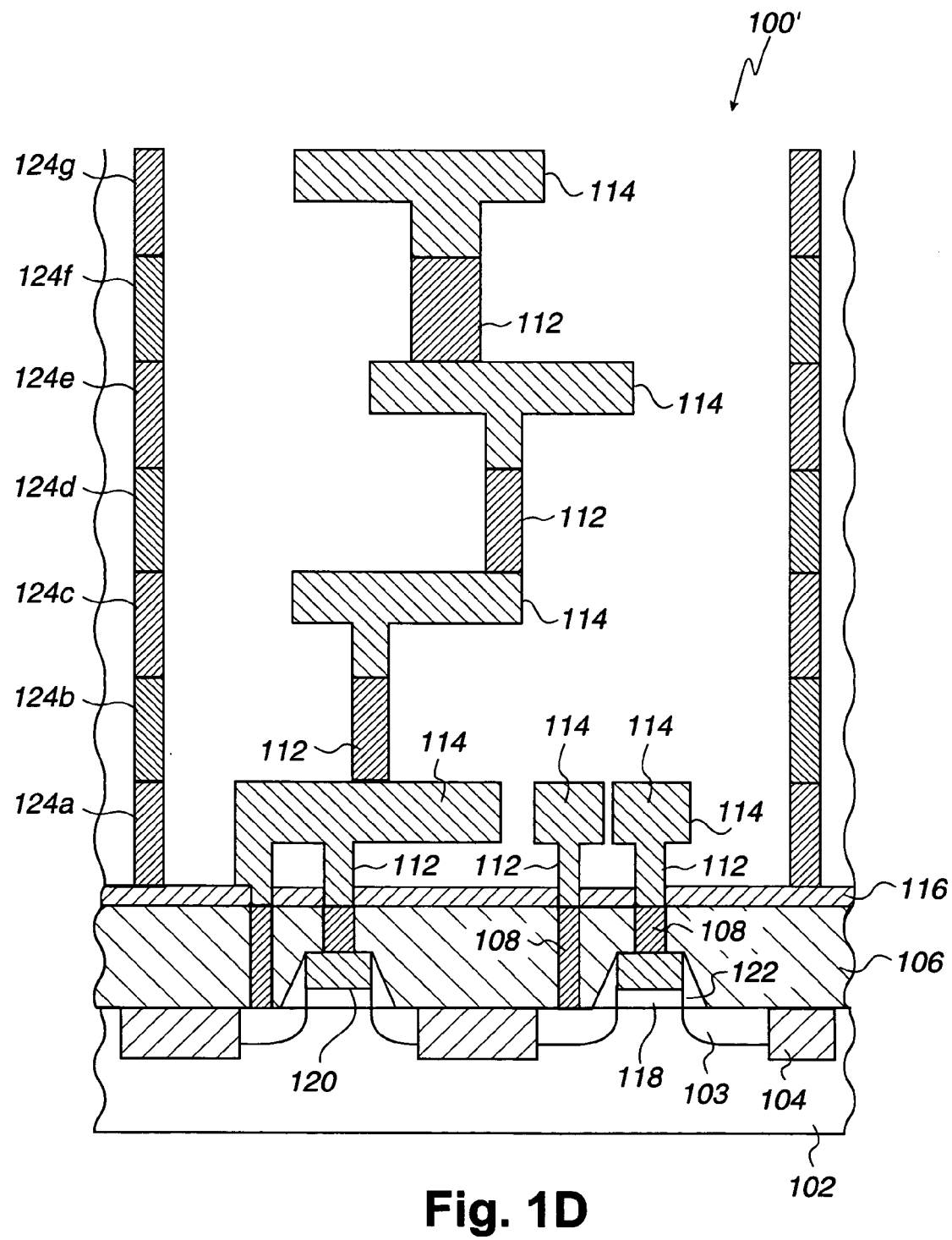
FIG. 1D is a simplified, partial, exploded, cross-sectional view of a post-etched multi-layer semiconductor structure having air as a dielectric material, in accordance with yet another embodiment of the present invention.

FIG. 1D is a cross-sectional view of a post-etched multi-layer semiconductor structure 100' having air as a dielectric material, in accordance with one embodiment of the present invention. As illustrated, the sacrificial layers 110a–110g of semiconductor 100 depicted in FIG. 1C have been etched. For example, the sacrificial layers 110a–110g may be removed through a wet etch process in which a mixture of hydrofluoric acid (HF) and de-ionized water (i.e., diluted HF (DHF)) is applied to the sacrificial layers 110a–110g thus removing the sacrificial material surrounding the conductive vias 113, metallization lines 115, and stubs 125a–125g. In one implementation, the sacrificial material may be removed by first immersing the semiconductor structure 100 in a tank containing a mixture of hydrofluoric acid and de-ionized water for a specific time. Thereafter, the mixture of hydrofluoric acid and de-ionized water is removed by rinsing the semiconductor structure 100, which is followed by performing a spin rinsing operation. In another embodiment, the immersion etching maybe enhanced by utilizing heaters and agitation devices (e.g., stirrers, ultrasonic, megasonic, etc.). In an alternate embodiment, rather than immersing the semiconductor structure 100, the etching operation may be performed through the spraying of the mixture of hydrofluoric acid and de-ionized water onto the semiconductor structure 100, thus creating a voided interconnect metallization structure. However, in another embodiment, an oxide plasma etch approach may be used to etch out the sacrificial material.

Preferably, the concentration of the hydrofluoric acid in the mixture of hydrofluoric acid and de-ionized water ranges between approximately about 0.1% to 5.0%. However, one of ordinary skill in the art must appreciate that the concentration of the hydrofluoric acid in the mixture of hydrofluoric acid and de-ionized water may be any appropriate concentration so long as the mixture has the capability to remove the sacrificial layers without effecting the metallization lines. Furthermore, although the mixture of hydrofluoric acid and de-ionized water has been used to perform the etching operation, it must be understood that any appropriate etchant having a suitable concentration may be used so long as the etchant is capable of removing the sacrificial materials.

It must be noted that the stubs 125a–125g, conductive vias 113, and the metallization lines 115 are configured not to be effected by the etching operation. That is, the stubs 125a–125g, conductive vias 113, and the metallization lines 115 are constructed from materials that are substantially inert to the mixture of hydrofluoric acid and de-ionized water. Furthermore, the removal of the sacrificial materials does not effect the electrical performance of the active components, as they are protected by the passivation layer 116. Additionally, although in this embodiment air has been used as an insulator, in a different implementation, any gas having a low-K dielectric constant (e.g., nitrogen, etc.) or any inert gas (e.g., neon, argon, etc.) may be used to substitute the sacrificial materials.

Figure 1E:
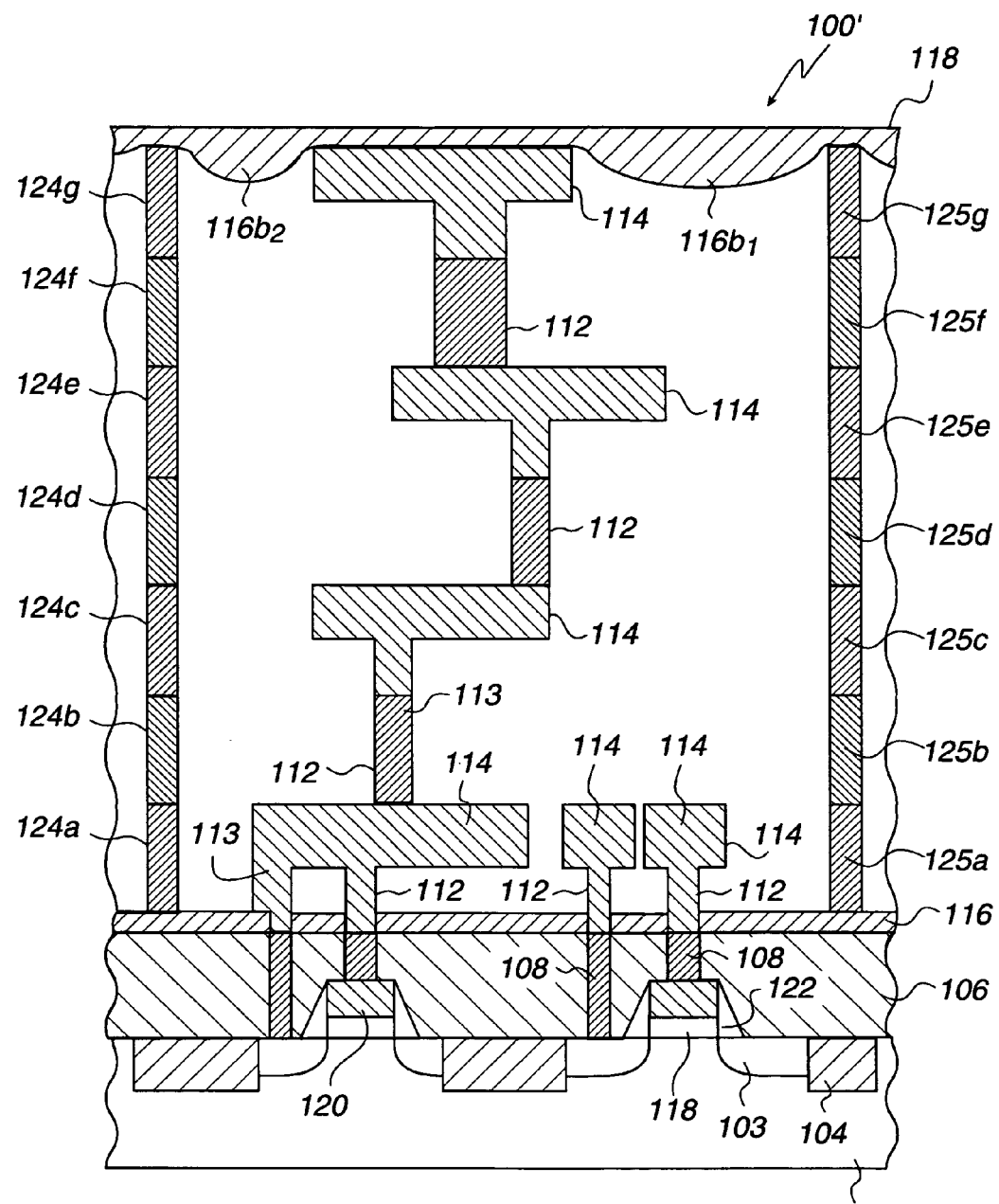
FIG. 1E is a simplified, partial, exploded, cross-sectional view of the post-etched air-dielectric multi-layer semiconductor structure of FIG. 1D further including a passivation-capping layer, in accordance with one aspect of the present invention.

Reference is now made to FIG. 1E illustrating the post-etched air-dielectric multi-layer semiconductor structure 100' of FIG. 1D further including the passivation-capping layer 118, in accordance with one embodiment of the present invention. As illustrated, in one example, the passivation-capping layer 118 may include a plurality of concavities $116b_1$ and $116b_2$ substantially formed in the voids created by the removal of the sacrificial layer 125g.

As shown, the passivation-capping layer 118 substantially concludes the fabrication of the semiconductor structure 100' and serves two purposes. Besides functioning as a sealing passivation layer, thus preventing corrosion and chemical reaction within the semiconductor structure 100', the passivation-capping layer 118 also functions as a cap for the semiconductor structure 100'. As such, the plurality of substantially contiguous columns of stubs 125a–125g provide sufficient support for the passivation-capping layer 118. In this manner, as fabricated, the passivation-capping layer 118, the plurality of stubs 125a–125g, the plurality of metallization lines 115, the plurality of conductive vias 113, and the substrate 102 create a semiconductor structure that has high structural integrity with reduced capacitive delay.

Figures 1, 1F:
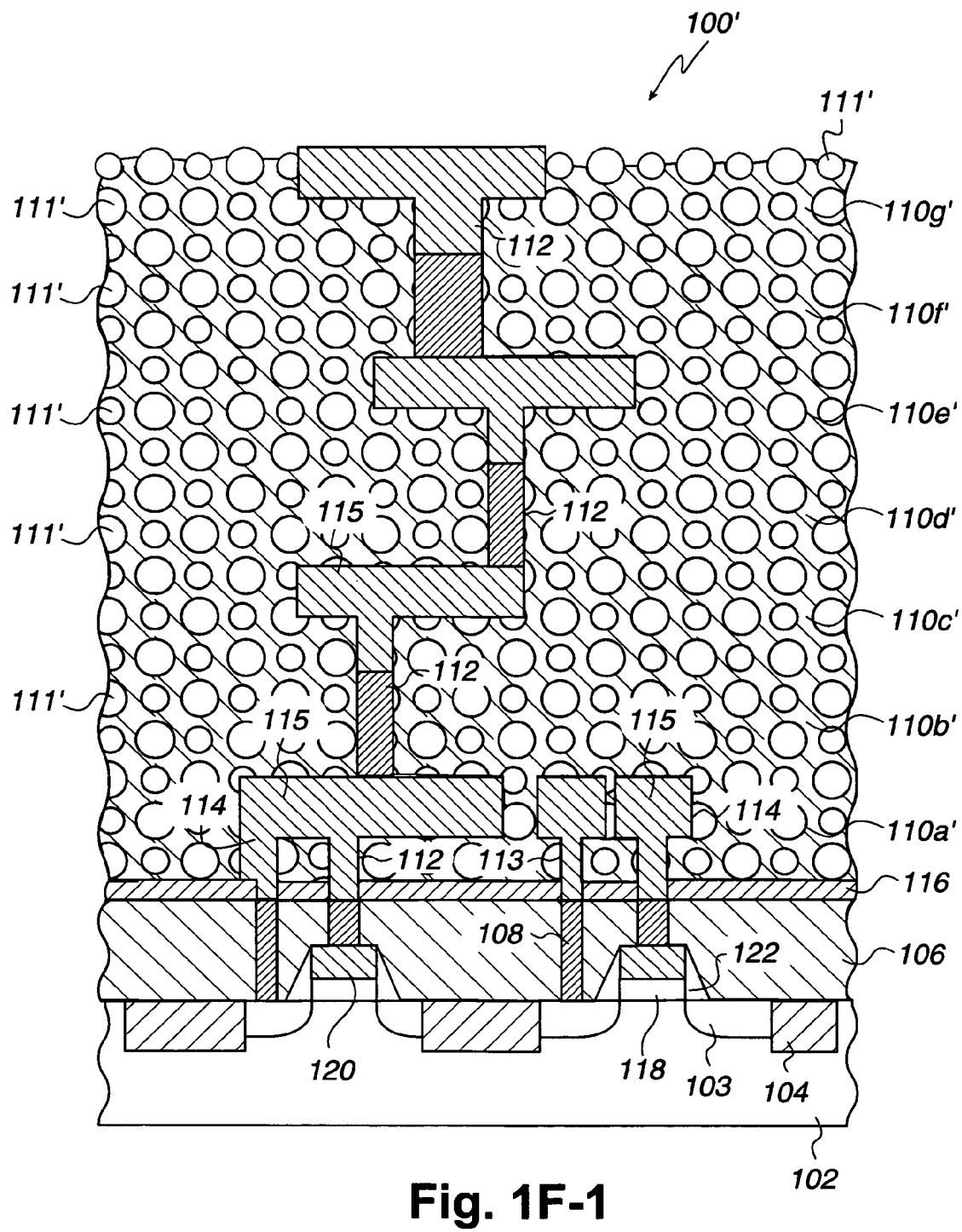
FIGS. 1F-1 is a simplified, partial, exploded, cross-sectional view of the post-etched multi-layer semiconductor structure of FIG. 1D having been filled with a porous low-K dielectric material, in accordance with another aspect of the present invention.

FIG. 1F-1 is a cross-sectional view of the post-etched multi-layer semiconductor structure 100' of FIG. 1D having low-K dielectric layers, in accordance with one embodiment of the present invention. As illustrated, the sacrificial layers 110a–10g have been substituted with dielectric layers 110a'–110g' made out of a low-K dielectric material 111. The low-K dielectric material 111 is configured to be a highly porous dielectric material preferably having a dielectric constant substantially close to that of air. As such, the low-K dielectric material includes a plurality of air-filled pores 111'. In one embodiment, the low-K dielectric material 111 may be Nanoglass™ from AppliedSignal Electronic Materials of Los Gatos, Calif., which is a silicon dioxide material with air-filled pores having a diameter as small as 10 nanometers. In a different embodiment, any porous low-K dielectric material may be implemented (e.g., a spin-on polymer, a CVD deposited organosilicate glass (OSG), a spin-on polymer and a CVD deposited OSG together spin on polymer combined with gas phase evaporation technique, spin on polymer combined with supercritical drying technique, porous silica aerogels, Dow Corning hydrogen silsesquioxan based porous XLK dielectric, silicon evaporation/oxidating deposition in argon/oxygen atmosphere, etc.). For porous materials, the effective dielectric constant ranges between the dielectric constant of air (i.e., 1) and the dielectric constant of the dense material Dow Corning XLK (i.e., 2.2). Hence, in preferred embodiments, the dielectric constant of the porous low-K dielectric material ranges from approximately about 1 to approximately about 4.

In one exemplary implementation, the post-etched semiconductor structure 100' is filled with the low-K dielectric material 111 through a spin on process or CVD process. Preferably, the low-K dielectric material 111 that is in the form of a liquid is introduced into the post-etched semiconductor structure 100' with pressure. In this manner, the low-K dielectric material 111 penetrates through almost all the etched regions of the semiconductor structure 100' approximately down to the first dielectric layer 110a'. In doing so, the post-etched regions of the semiconductor structure 100' can be filled with low-K dielectric material 111 such that substantially all the existing voids are filled with the low-K material 111. However, it will be understood by one of ordinary skill in the art that depending on the required mechanical strength of the semiconductor structure 100" and the low-K dielectric material, the low-K dielectric material 111 may be introduced into the semiconductor structure 100' such that some void still remains subsequent to the filling operation. For instance, in one aspect, the post-etched semiconductor structure 100' may be filled such that substantially the upper dielectric layers are filled with the low-K dielectric material 111 while the lower dielectric layers remain almost vacant.

Figures 1, 1F, 2:
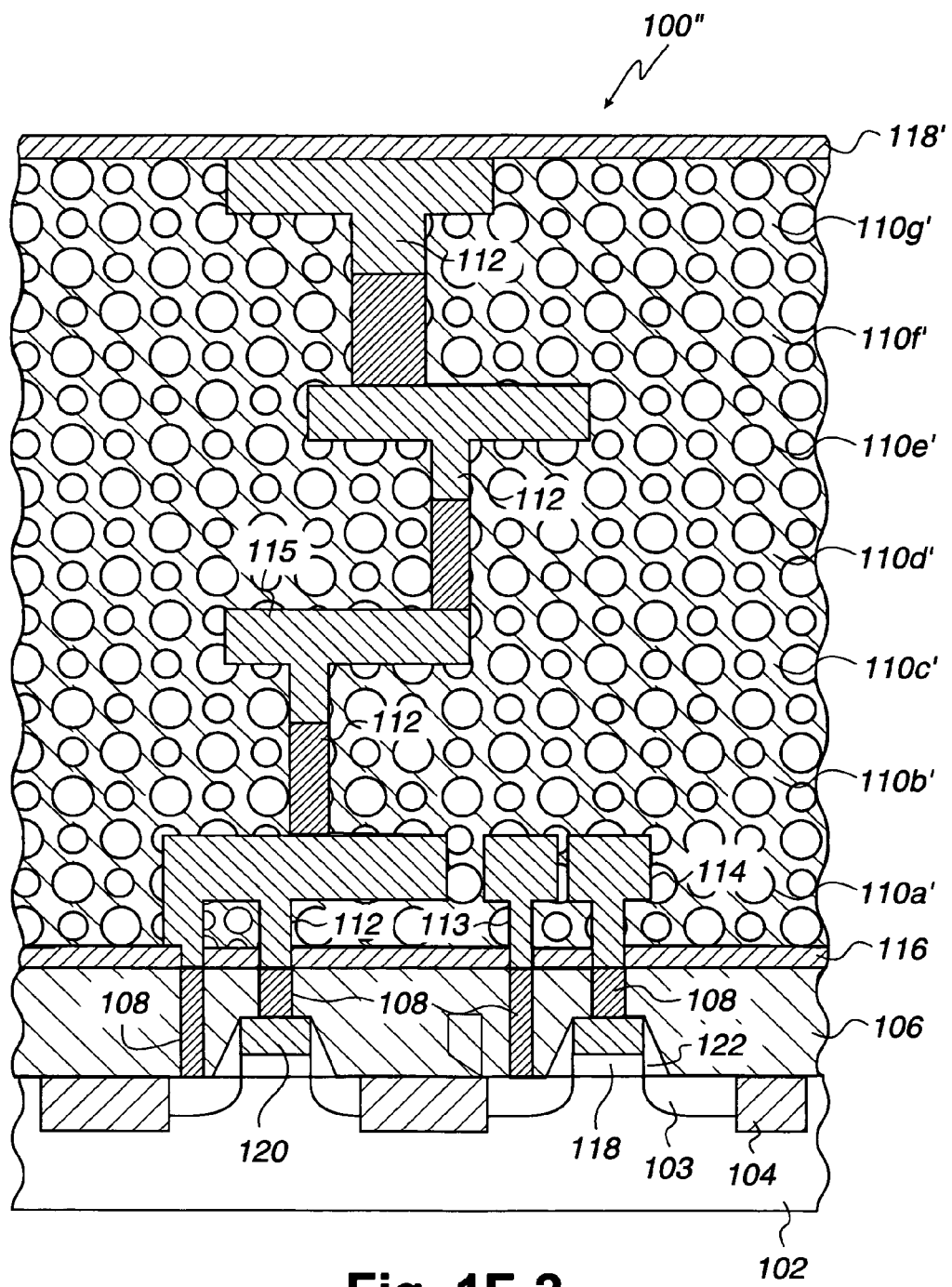

Following the introduction of the low-K dielectric material 111, as illustrated in FIG. 1F-2, the post-etched low-K dielectric semiconductor structure 100" is covered with a passivation-capping layer 118', in accordance with one implementation of the present invention. As shown, the passivation-capping layer 118' functions as a sealing passivation layer as well as a lid. As depicted, the passivation-capping layer 118', the first through seventh dielectric layers 110a'–110g', and the substrate 102 form a semiconductor structure 100" that has high structural integrity with low capacitive delay. FIG. 1F-3 illustrates the post-etched multi-layer semiconductor structure 100' of FIG. 1D having low-K dielectric layers, as covered by the passivation-capping layer 118', in accordance with another embodiment of the present invention.

Although in these embodiments the sacrificial layers 110a–110g have been made out of silicon dioxide, it will be known to those skilled in the art that any inert to copper material that is mechanically firm to be implemented during the fabrication process may be used to form the sacrificial layers. It should be noted that the function of the sacrificial layers is to provide good mechanical support during the fabrication of the multi-layer interconnect structures. This mechanical support is needed so that the interconnect structures can withstand the structural stresses and pressures that occur during CMP and other operations.

Reference is now made to FIG. 2, which depicts a flowchart diagram 200 of the process operations performed to fabricate an air dielectric semiconductor structure having a plurality of copper metallization lines and supporting stubs, in accordance to one embodiment of the present invention. The method begins at an operation 202 in which a substrate having active regions is provided. Next, in operation 204, shallow trench isolation regions are formed in the substrate followed by operation 206 in which transistor structures are formed in the active regions.

Once the transistors are defined, the method continues on to operation 208 in which the ILD is formed over the substrate surface. Thereafter, in operation 210, tungsten contact plugs configured to provide direct access between the metallization lines and the transistors are formed through the ILD. The formation of tungsten contact plugs requires the deposition of tungsten onto the surface of the ILD as well as into the vias to form tungsten plugs. Accordingly, in the subsequent operation 212, the tungsten overlying the ILD surface is planarized thus removing the overburden tungsten. This operation is then followed by operation 214 in which a passivation layer is formed over the ILD to protect the active components of the substrate from contamination.

At this point, the method continues to operation 216 in which a sacrificial layer is formed over the previously formed layer. Thereafter, in operation 216, via holes and trenches are formed in the sacrificial layer. Preferably, this is achieved through a via-first, trench-first or a buried-via dual damascene process. Following the formation of via holes and trenches, in operation 220, stub holes are formed through the sacrificial layer so as to support the multi-layer semiconductor structure. In this manner, the supporting stubs are formed within each sacrificial layer thus providing support for a subsequently formed passivation-capping layer. In some cases, the stub holes can be formed at the same time the via holes are formed.

Subsequent to the formation of the via holes, trenches, and stub holes, in operation 222, copper is applied onto the surface of the sacrificial layer and into the via holes, trenches, and stub holes, thus filling the trenches, via holes, and stub holes. As copper is deposited into the via holes, trenches, and stub holes, overburden copper remains on the surface of the sacrificial layer. Accordingly, in operation 224, the overburden copper is planarized and the substrate surface is cleaned thus removing any contaminants remaining on the substrate surface. Preferably, the overburden copper is planarized through a chemical mechanical planarization (CMP) operation. It is important to note that the interconnect structure is very stable during the CMP operation since sacrificial material is still present.

Thereafter, the method continues on to operation 226 in which it is determined whether any additional metallization lines need to be formed. If it is determined that additional metallization lines are required, the method returns to operation 216 in which a sacrificial layer is formed over the previously formed layer. In contrast, if there is no need to form additional metallization lines, the method continues on to operation 228 in which the sacrificial layers not protected by the passivation layer are etched and removed. The removal of the sacrificial material is achieved by applying a mixture of HF and de-ionized water to the multi-layer semiconductor structure. Finally, the method continues on to operation 230 in which a passivation-capping layer is formed over the last copper metallization layer and concludes the fabrication process.

Figures 1, 1F, 2, 3:
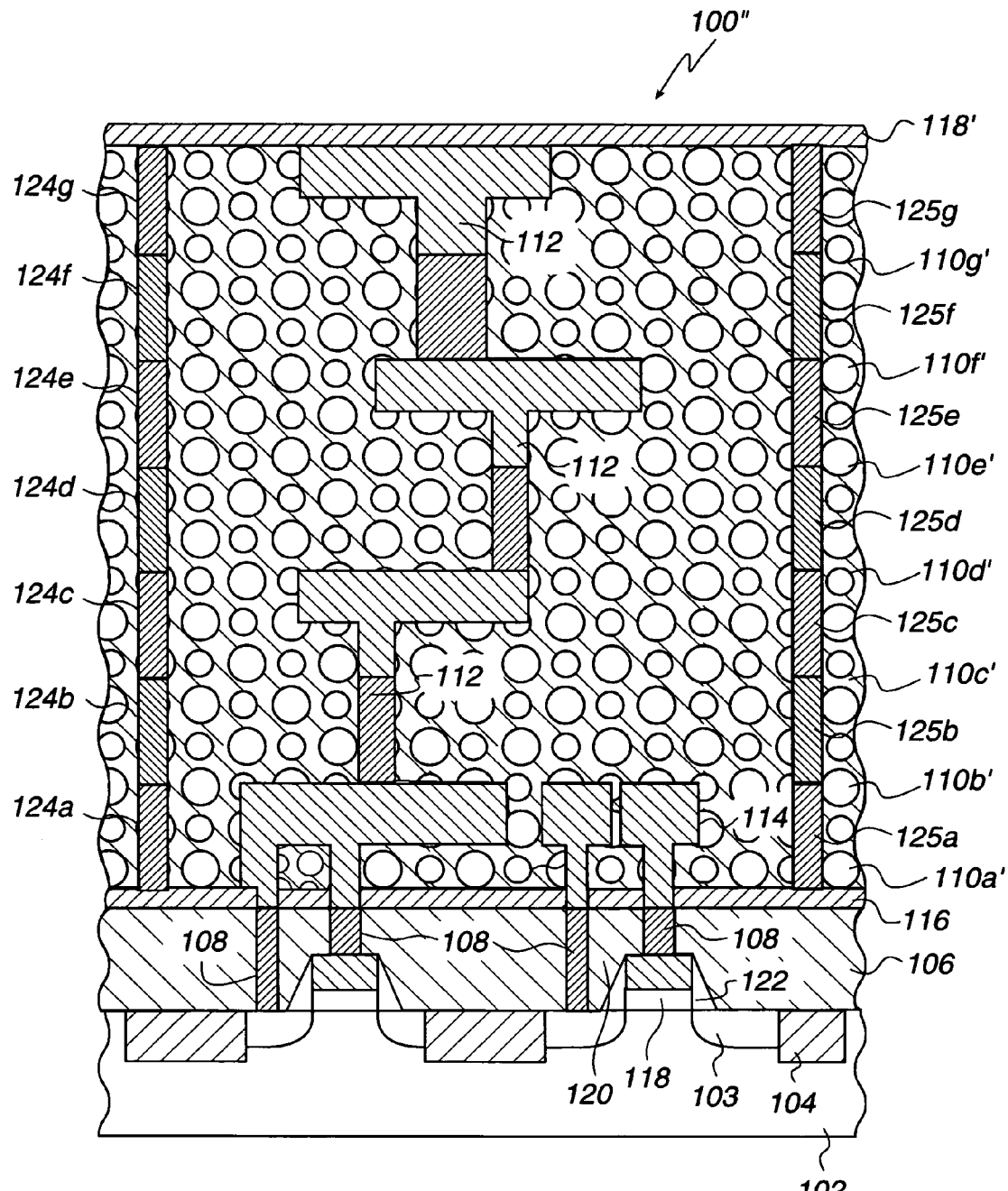
Figure 2:
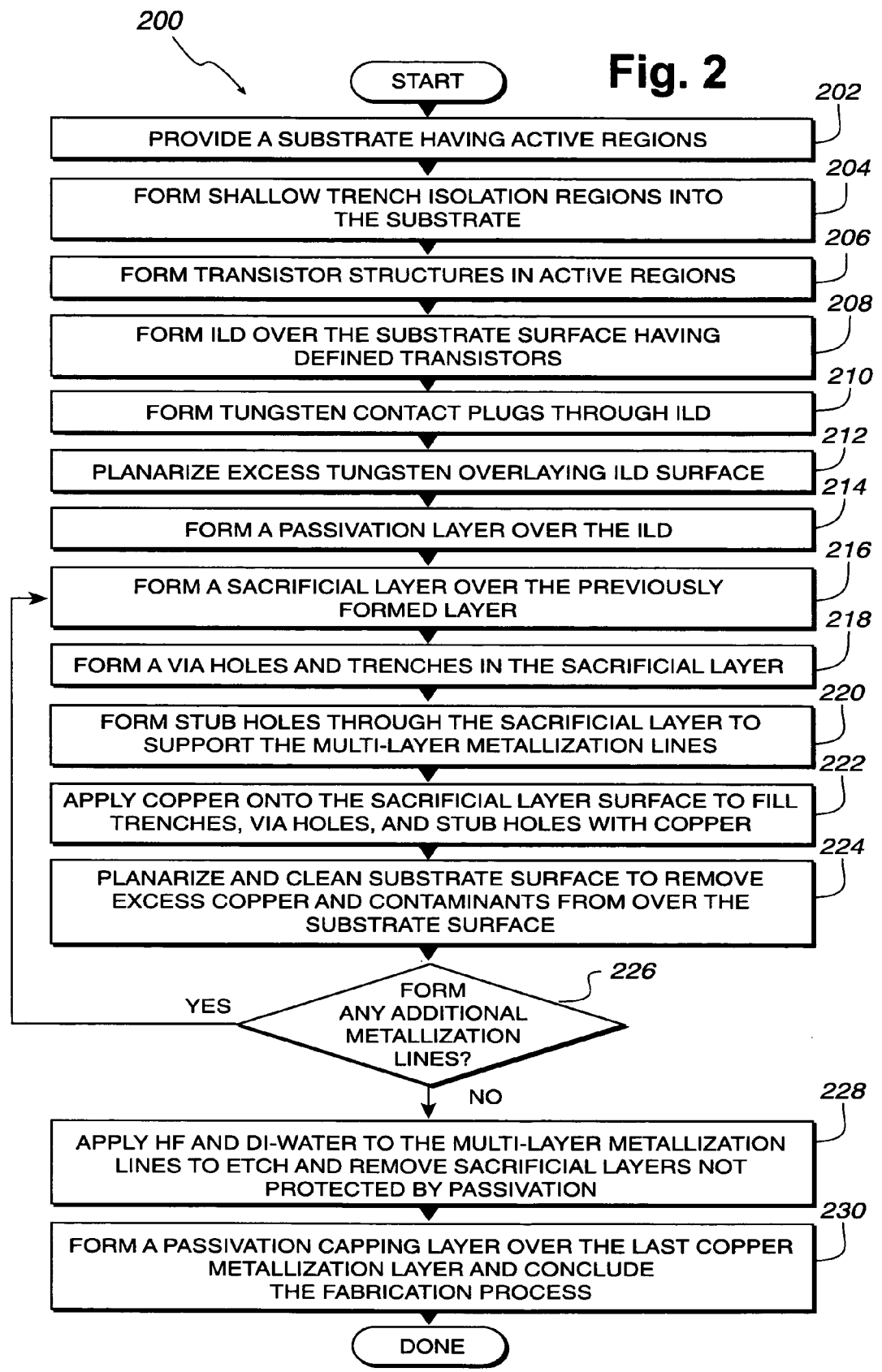

Another embodiment of the present invention can be understood from the flowchart 300 of FIG. 3 depicting a flowchart diagram 300 of the process operations performed to fabricate a porous low-K dielectric semiconductor structure having copper metallization lines, in accordance to one embodiment of the present invention. This method begins by operation 302 in which a substrate having active regions is provided. Next, in operation 304 shallow trench isolation regions are formed into the substrate followed by operation 306 in which transistor structures are formed in active regions. Subsequent to the formation of the transistor structures, in operation 308, the ILD is formed over the substrate surface followed by forming of tungsten contact plugs through the ILD in operation 310. Thereafter, the overburden tungsten overlaying the surface of the ILD is planarized. This is followed by operation 314 in which a passivation layer is formed over the ILD so as to protect the active components of the substrate.

After the forming of the passivation layer, in operation 316 a sacrificial layer is formed over the previously formed layer which is followed by forming of via holes and trenches through the sacrificial layer in operation 318. Thereafter, in operation 320, copper is applied onto the surface of the sacrificial layer thus filling the trenches and via holes. In operation 322, a planarization and cleaning operation is subsequently performed so as to remove overburden copper and contaminants from over the substrate surface.

Proceeding to operation 324, a determination is made as to whether any additional metallization lines need to be formed. If a determination is made that an additional metallization line is required, the method then continues on to operation 316. Alternatively, the method continues to operation 326 in which sacrificial layers not protected by the passivation layer are etched and removed. The removal of sacrificial layers is achieved by applying a mixture of HF and de-ionized water or any other chemical suitable for dissolving the sacrificial layers to the multi-layer semiconductor structure. Subsequently, in operation 328, the sacrificial layers are replaced by porous low-K dielectric material. Lastly, in operation 330, a passivation-capping layer is formed over the last copper metallization layer thus concluding the fabrication process.

Again, it should be noted that the interconnect structure will be mechanically stable during each of the CMP operations since dense sacrificial material is still present. Once there is no need for further CMP operations, the sacrificial material is removed. Once removed, the interconnect structure can be filled with low K dielectric materials or left as air dielectric. The low K dielectric or air will therefore provide for faster integrated circuit devices.

Although the foregoing invention has been described in some detail for purposes of clarity of understanding, it will be apparent that certain changes and modifications may be practiced within the scope of the appended claims. For example, embodiments described herein have been primarily directed toward fabrication of semiconductor structures having copper metallization lines; however, it should be understood that the fabrication processes of the present invention are well suited for fabricating semiconductor structures having any type of metallization lines (e.g., aluminum, tungsten and other metals or alloys). Accordingly, the present embodiments are to be considered as illustrative and not restrictive, and the invention is not to be limited to the details given herein, but may be modified within the scope and equivalents of the appended claims.

What is claimed is:

1. A semiconductor device, comprising:
    a substrate having transistor devices and a passivation layer disposed over a dielectric layer that is defined over the transistor devices;
    a plurality of copper interconnect metallization lines and conductive vias defined in each of a plurality of interconnect levels of the semiconductor device, the plurality of copper interconnect metallization lines and conductive vias being isolated from each other by a porous dielectric material; and
    a plurality of supporting stubs, each of the plurality of supporting stubs configured to form a supporting column that is disposed over a surface of the passivation layer and extends through the plurality of interconnect levels of the semiconductor device, the plurality of supporting stubs not being electrically interconnected to the plurality of copper interconnect metallization lines and conductive vias so that the supporting column maintains structural contact with the passivation layer to avoid electrical contact with the plurality of copper interconnect metallization lines and conductive vias, the plurality of supporting stubs further being configured so as to not provide electrical connection between the plurality of interconnect levels of the semiconductor device.

2. The semiconductor device as recited in claim 1, further comprising:
    a passivation-capping layer defined over a topmost layer of the copper interconnect metallization lines and conductive vias.

3. The semiconductor device as recited in claim 1, wherein the plurality of copper interconnect metallization lines and conductive vias define dual damascene structures.

4. The semiconductor device as recited in claim 1, wherein the plurality of supporting stubs further support a passivation-capping layer.

5. A semiconductor device, comprising:
    a substrate having transistor devices;
    an intermetal dielectric layer (ILD) including conductive contacts defining a first interconnect level of a plurality of interconnect levels of the semiconductor device;
    a passivation layer defined over the ILD layer;
    a plurality of copper interconnect metallization lines and conductive vias defined in each remaining interconnect level of the plurality of interconnect levels of the semiconductor device defined over the passivation layer, the plurality of copper interconnect metallization lines and conductive vias being isolated from each other by only a porous dielectric material; and
    a plurality of supporting stubs, each of the plurality of supporting stubs configured to form a supporting column that extends through each remaining interconnect level of the plurality of interconnect levels of the semiconductor device.

6. The semiconductor device as recited in claim 5 wherein the plurality of supporting stubs is not electrically interconnected to the plurality of copper interconnect metallization lines and conductive vias.

7. The semiconductor device as recited in claim 5, wherein the plurality of supporting stubs further support a passivation-capping layer.

8. A semiconductor device, comprising:
    a substrate having transistor devices;
    an intermetal dielectric layer (ILD) including conductive contacts defining a first interconnect level of a plurality of interconnect levels of the semiconductor device, the conductive contacts being isolated from each other by a non-porous dielectric;
    a passivation layer defined over the ILD layer;
    a plurality of copper interconnect metallization lines and conductive vias defined in each remaining interconnect level of the plurality of interconnect levels of the semiconductor device, the plurality of copper interconnect metallization lines and conductive vias being isolated from each other by one of only a porous dielectric material and a mixture of only a porous dielectric material and a gaseous dielectric;
    a passivation-capping layer defined over a topmost layer of the copper interconnect metallization lines and conductive vias; and
    a plurality of supporting stubs, each of the plurality of supporting stubs configured to form a supporting column that extends through each remaining interconnect level of the plurality of interconnect levels of the semiconductor device.

* * * * *